United States Patent [19]

Huang

[11] Patent Number: 4,907,041

[45] Date of Patent: Mar. 6, 1990

[54] INTRA-GATE OFFSET HIGH VOLTAGE THIN FILM TRANSISTOR WITH MISALIGNMENT IMMUNITY

[75] Inventor: Tiao-Yuan Huang, Cupertino, Calif.

[73] Assignee: Xerox Corporation, Stamford, Conn.

[21] Appl. No.: 245,872

[22] Filed: Sep. 16, 1988

[51] Int. Cl.$^4$ .................. H01L 27/12; H01L 29/78
[52] U.S. Cl. ......................................... 357/4; 357/23.7; 357/23.14; 357/23.9
[58] Field of Search .................. 357/23.7, 23.14, 23.9, 357/4

[56] References Cited

U.S. PATENT DOCUMENTS

| | | | |
|---|---|---|---|
| 4,651,186 | 3/1987 | Yamatoto | 357/23.14 |
| 4,721,986 | 1/1988 | Kinzer | 357/23.14 |
| 4,803,530 | 2/1989 | Tango | 357/23.7 |

Primary Examiner—Martin H. Edlow
Attorney, Agent, or Firm—Serge Abend

[57] ABSTRACT

A high voltage thin film transistor comprising a substrate upon which is supported a non-single crystal semiconductor active layer, spaced from a pair of conductive gate electrodes by a gate dielectric layer, wherein one of the gate electrodes is the device control electrode and the other is a dummy-drain electrode. Heavily doped semiconductor source and drain electrodes are in substantially alignment with the outer edges of the gate electrodes, the source electrode being aligned with the device control electrode and the drain electrode being aligned with the dummy-drain electrode. The active layer has intrinsic or virtually intrinsic region thereof in opposition to the bodies of each of the gate electrodes, and an offset region, between the gate electrodes, having a lower dopant level than the source and drain electrodes, which is aligned with the inner edges of the gate electrodes.

6 Claims, 6 Drawing Sheets

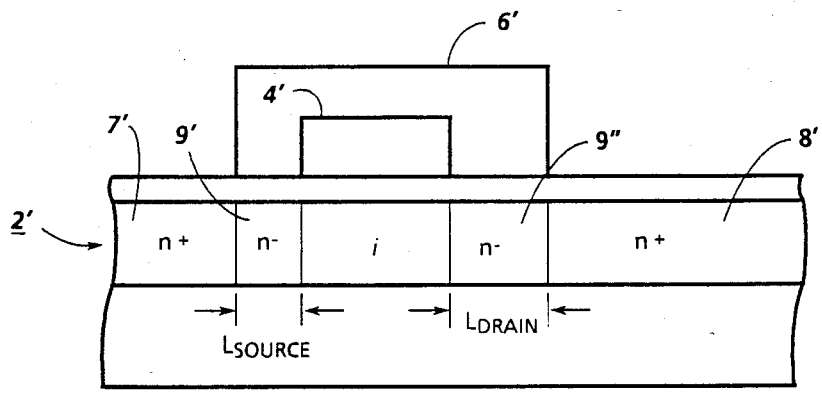
(PRIOR ART) *FIG. 3*
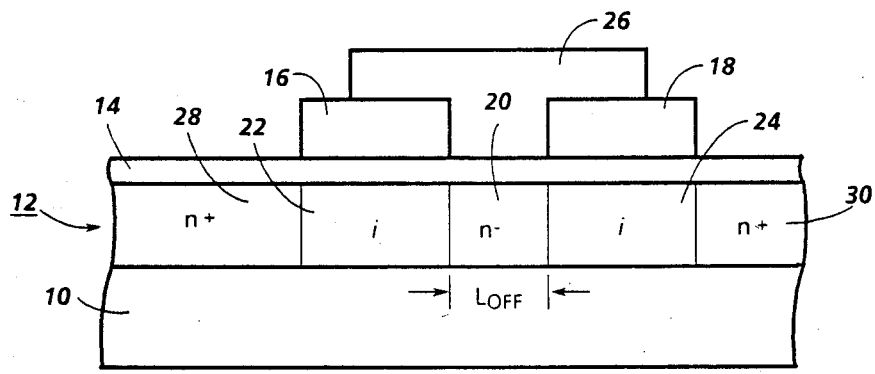
*FIG. 4*
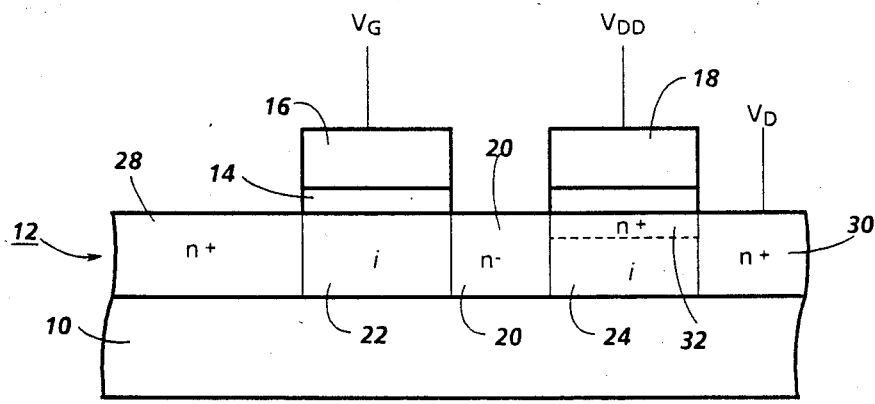
*FIG. 5*

INTRA-GATE OFFSET HIGH VOLTAGE THIN FILM TRANSISTOR WITH MISALIGNMENT IMMUNITY

FIELD OF THE INVENTION

The present invention relates to an improved high voltage thin film transistor and to an improved method for fabricating it by precisely establishing the critical drain-to-gate offset length ($L_{OFF}$) with a single mask so as to make this device parameter immune to alignment errors.

BACKGROUND OF THE INVENTION

Thin film transistors, made of amorphous or polycrystalline silicon, or other suitable semiconductor materials, are widely used as low voltage pixel addressing elements in large area, flat panel displays because of their low cost and low processing temperature. Conventional low voltage MOSFET transistors are not capable of sustaining more than 20 or 30 volts before gate-induced junction breakdown occurs, caused by the gate electrode being aligned with or overlapping the drain electrode. It can be observed that when a drain voltage in excess of 20 to 30 volts is applied, leakage current starts to increase, even when the gate voltage ($V_G$) is zero. Therefore, since the transistor cannot be switched to an OFF condition, the ON/OFF ratio will be very low and the device will have very little practical application as a high voltage logic circuit element. This phenomenon can be seen clearly in curves A (ON) and B (OFF) of FIG. 1 wherein there is shown the operational characteristics of a low voltage transistor in the form of a conventional dual gate device, comparable to that illustrated and described in "MOS Field Effect Transistors and Integrated Circuits" (Richman), at pages 191-193. It should be noted that while device operation is satisfactory when $V_G$ is high (e.g. 30 volts), satisfactory operation is only exhibited at low drain voltages ($V_D$) when $V_G$ is low (0 volts), for switching OFF the device. The OFF-state leakage current ($I_{LEAK}$) starts to increase at a drain voltage of about 25 volts, and the device reaches breakdown, as defined arbitrarily by a leakage current ($I_{LEAK}$) of about 10 nA (1E-08) at around 33 volts. At high drain voltages, the leakage current is so high that it is difficult to distinguish between ON and OFF states.

Many applications require drive voltages well in excess of 100 volts, for example, ferroelectric liquid crystal, electrophoretic or PLZT electro-optic displays. The intent in designing a high voltage thin film transistor is to extend the low current regime of low gate voltages ($V_G=0$) to higher drain voltages, as shown in curve C of FIG. 1. A high voltage thin film transistor capable of sustaining 400 volt, or greater, operation is described in U.S. Pat. No. 4,752,814 (Tuan), entitled "High Voltage Thin Film Transistor" and assigned to the same assignee as this application.

In order to sustain drain bias voltages greater than 60 volts, and as much as several hundred volts, without incurring drain junction breakdown, high voltage thin film transistors require that the drain be offset from the gate.

Such devices include, within the active layer, an offset region ($L_{OFF}$) of intrinsic or lightly doped semiconductor ($n^-$ or $p^-$) between the channel region under the gate and the heavily-doped $n^+$ (or $p^-$) drain. It is well known that $L_{OFF}$ is a critical device parameter in offset-gate HVTFTs which influences device performance, so that any variations will change the device characteristics. A large $L_{OFF}$ increases the drain breakdown voltage $V_{BD}$, reduces the current-drive $I_D$, and worsens the current pinching effects observed under low drain biases. Precise control of $L_{OFF}$ is especially critical for large-area electronics where the alignment error across a large area substrate can be more severe. Therefore, HVTFT device structures with high alignment accuracy are greatly desirable and of technological importance.

A conventional method for achieving a drain side offset region, $L_{OFF}$, (between the $n^+$ drain and the gate) is illustrated in FIG. 2. Upon substrate 1 there is deposited an active semiconductor layer 2 and a gate dielectric layer 3. A first mask (not shown) defines the placement of gate electrode 4 upon the gate dielectric layer. After the gate 4 has been formed, the active semiconductor layer 2 receives an $n^-$ implant, leaving underlying channel 5 undoped. A second mask 6 establishes the the drain offset length $L_{OFF}$ relative to the gate edge, so that an $n^+$ implant with the mask in place forms the $n^+$ source and drain regions 7 and 8. The $n^-$ region 9 defines the drain offset length $L_{OFF}$. The degree of accuracy achieved in establishing this length is dependent upon the exactness of alignment between the second mask 6 and the gate mask. It should be understood that this length is very sensitive to misalignments. Furthermore, there is an intrinsic alignment limitation when two masks are used, regardless of the precision exercised by the operator. Although this limitation can be ameliorated by precise alignment tools, which drive up processing time and costs, exact alignment is not possible.

A method which has been suggested for overcoming the misalignment problem is illustrated in FIG. 3. This approach is more fully described in "High-Voltage Silicon Thin Film Transistor on Quartz" authored by Unagami and Tsujiyama, and published in IEEE Electron Device Letters, Vol. EDL-3, No. 6, June 1982, at pages 167-168, and in "Fabrication of High Voltage Polysilicon TFTs on an Insulator" authored by Pennell, Catero and Lovelis, and published in the Journal of the Electrochemical Society: Solid State Science and Technology, Vol. 133, No. 11, November 1986 at pages 2358-2361.

Elements in FIG. 3 similar to those illustrated in FIG. 2 are identified with the same numerals with a prime (') attached. Instead of merely providing an offset region on the drain electrode side of gate 4', $n^-$ offset regions 9' and 9'' are located on the source and drain electrode sides by means of a single straddling mask 6'. The rationale for this modification is to use a single offset mask 6', straddling the gate 4' to obtain a constant total offset length ($L_{source}+L_{drain}=K$) irrespective of misalignment errors. A drawback to this approach is that the introduction of source side offset 9' degrades device performance by introducing a series resistance and lowering the device current $I_D$, but it has only little positive effect upon the breakdown voltage. The single mask 6' is still susceptible to misalignment relative to the gate, but its salutory effect is to improve device-to-device current uniformity across a large area substrate. This is because the benefit achieved by the drain side offset 9'' will be balanced by the negative effect of the source side offset 9'. A longer drain side offset decreases $I_D$ as does a longer source side offset, and vice versa. Therefore, since a longer $L_{drain}$ will be associated with a shorter $L_{source}$, and vice versa, misalignments across the substrate will result in a lower absolute value of $I_D$, because of the introduction of $L_{source}$, but the bandwidth of the current uniformity will be narrower than that of the HVTFT fabricated by the FIG. 2 method. Nevertheless, the devices will have a higher breakdown voltage because of the introduction of $L_{drain}$.

It is the object of my invention to provide a high voltage thin film transistor having improved uniformity and reproducibility, which includes an offset region of precise length $L_{OFF}$ only on the drain side of the control gate.

It is another object of my invention to provide a method for fabricating a high voltage thin film transistor which is totally immune to misalignment errors in the formation of an offset region between the control gate and the drain electrode.

SUMMARY OF THE INVENTION

My invention may be carried out, in one form, by providing an intra-gate-offset (ITGO) high voltage thin film transistor comprising a substrate upon which is supported a non-single crystal semiconductor active layer, a pair of conductive gate electrodes, one being the device control electrode and the other being a dummy-drain electrode, a gate dielectric layer separating the active layer and the pair of gate electrodes, and heavily doped semiconductor source and drain electrodes. The source and drain electrodes are in substantial alignment with the outer edges of the gate electrodes, the source electrode being aligned with the device control electrode and the drain electrode being aligned with the dummy-drain electrode. The active layer is contiguous with the source and drain electrodes, has intrinsic or virtually intrinsic regions thereof in alignment with the bodies of each of the gate electrodes, and includes an offset region having a lower dopant level than the source and drain electrodes which is aligned with the inner edges of the gate electrodes.

BRIEF DESCRIPTION OF THE DRAWINGS

Other objects and further features and advantages of my invention will be apparent from the following, more particular, description considered together with the accompanying drawings, wherein:

FIG. 3 is a schematic representation of the masking means described in the literature for forming the drain and source side offset regions in a high voltage thin film transistor;

FIG. 4 is a schematic representation of the masking means for forming the drain side offset region in my ITGO high voltage thin film transistor;

FIG. 5 is a view of my ITGO high voltage thin film transistor connected in the external bias mode;

DETAILED DESCRIPTION OF THE INVENTION

Figure 1:
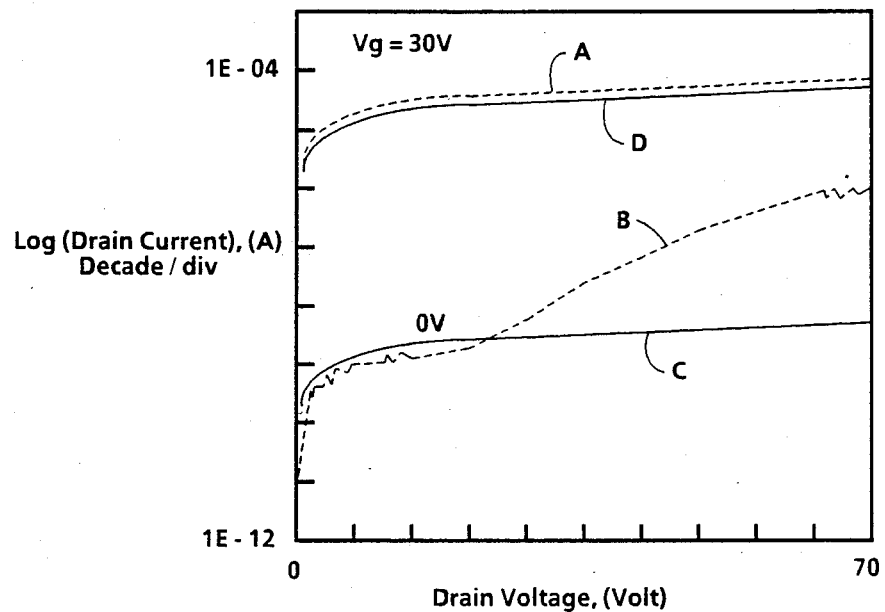
FIG. 1 shows plots of OFF-state and ON-state drain current as a function of drain voltage for a conventional low voltage thin film transistor and for my ITGO high voltage thin film transistor.

There is illustrated in FIG. 4 the salient features of the masking method I have developed for carrying out my invention for precisely establishing the drain offset length, $L_{OFF}$ by eliminating the effect of mask misalignment errors. A substrate 10, preferably made of glass or quartz, has deposited thereon a non-single crystal semiconductor active layer 12, which may be in the amorphous, microcystalline or polycrystalline form. Although I have found silicon to be the semiconductor material of choice for my applications, it should be understood that the principle of operation of my novel device is not dependent upon the material used, and that other suitable semiconductor materials, such as, for example, GaAs, GaAsP, SiC can be used with equal efficacy. A thin gate dielectric layer 14 is deposited over semiconductor layer 12. Two polysilicon gates 16 and 18, patterned by a first mask (not shown), are deposited upon the dielectric layer. The gates define an offset region 20 precisely separated by the distance $L_{OFF}$. A low level $n^-$ (or $p^-$) dopant implantation step may follow to dope all the unmasked portions of semiconductor layer 12 with a dopant level desired for offset region 20 (i.e. less highly doped than the source and drain electrodes). The doping level of the offset region will be selected in accordance with the expected voltage level of operation and the distance $L_{OFF}$. Thus, it is conceivable that in some instances it should remain intrinsic (i.e. undoped), as are the channel regions 22 and 24, located in opposition to the gate bodies. The next step is the deposition of a second mask 26 over the gates so as to mask the offset region 20 during the heavier $n^+$ (or $p^+$) doping of source and drain electrodes 28 and 30, respectively. Because the mask 26 merely serves to cover the offset region during $n^+$ doping step, it requires only very rough alignment, relative to the first mask. The remaining steps are the same as in conventional processing, and will not be described.

Figure 2:
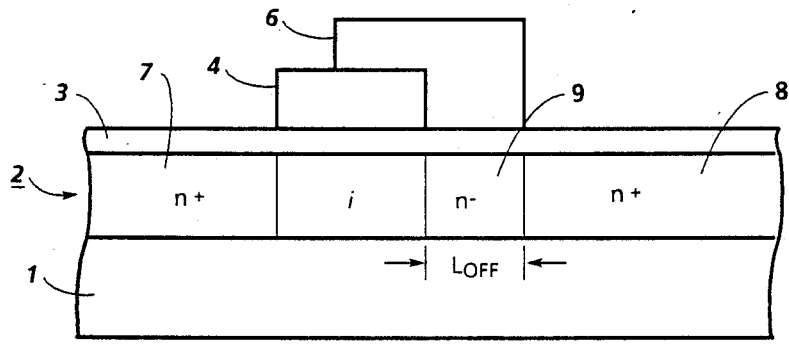
FIG. 2 is a schematic representation of the masking means conventionally employed for forming the drain side offset region in a high voltage thin film transistor.

In addition to the greater accuracy of my method, the cost of performing it is less than conventional NMOS or CMOS methods. While the number of processing steps is the same, the second mask, which only requires rough alignment, is cheaper to process than the conventional critical alignment drain side offset mask of FIG. 2. Furthermore, despite the fact that the operator of the conventional processing method must spend more time with the critical alignment mask, absolutely precise positioning is not possible because of intrinsic alignment errors beyond the operator's control.

The operation of my novel device will now be described with reference to FIGS. 5 and 6. In each device the $n^+$ source 28 and drain 30 is self-aligned to the outer edge of its respective gate, 16 and 18. Gate 16 is the conventional device control gate while gate 18 serves as a dummy drain. The ITGO HVTFT may be operated in a fixed bias mode as illustrated in FIG. 5, wherein the dummy drain 18 is connected to a source of constant voltage, such as the supply voltage $V_{DD}$. Alternatively, it may be tied directly to the drain electrode bias $V_D$. In each case, the high voltage applied to the dummy gate inverts a conductive channel 32 within the intrinsic semiconductor channel 24, in a region adjacent to the gate dielectric 14. Thus, the conductive channel 32 effectively extends the n+ drain electrode up to the n− offset region 20. When the dummy drain 18 is tied to $V_{DD}$, the transistor under gate 18 is always ON, so the ITGO device performs in a manner similar to a conventional HVTFT with a drain side offset equal to $L_{OFF}$. When the dummy drain is is tied to the drain bias, no conductive channel is formed when $V_D<V_{TH}$, and the device is OFF.

The excellent dimensional control afforded by my novel process enables reproducible device performance and uniformity, from device-to-device, across the wafer. In operation, my ITGO HVTFT is comparable to the conventional HVTFT, but its performance is superior because the precise length of $L_{OFF}$ is established. More particularly, circuit performance is enhanced because all of the devices are more uniform.

Figure 6:
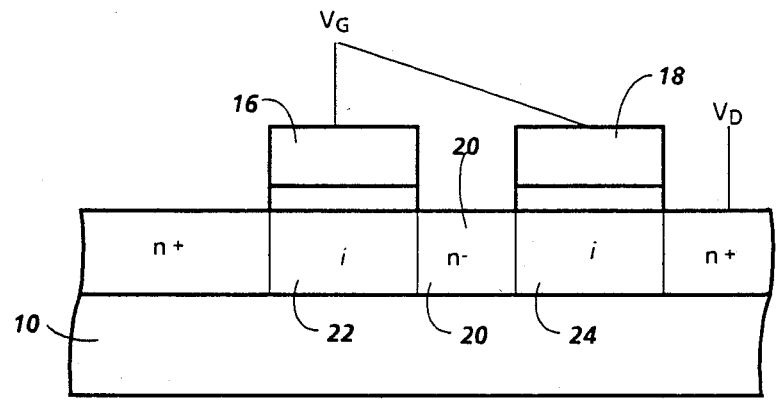
FIG. 6 is a view of my ITGO high voltage thin film transistor connected in the tied gates mode.

An alternative to the fixed bias mode of FIG. 5 is the tied-gates mode shown in FIG. 6, wherein both the control gate 16 and the dummy drain 18 are connected to a same potential source. When $V_G=0$, virtually no current will flow. When $V_G>V_{TH}$, a conductive region will be induced in each channel 22 and 24 so as to switch the transistor ON. It should be appreciated that while I have referred to gate 18 as a dummy drain, it will not act a a drain when operating in the tied-gates mode.

Figure 7:
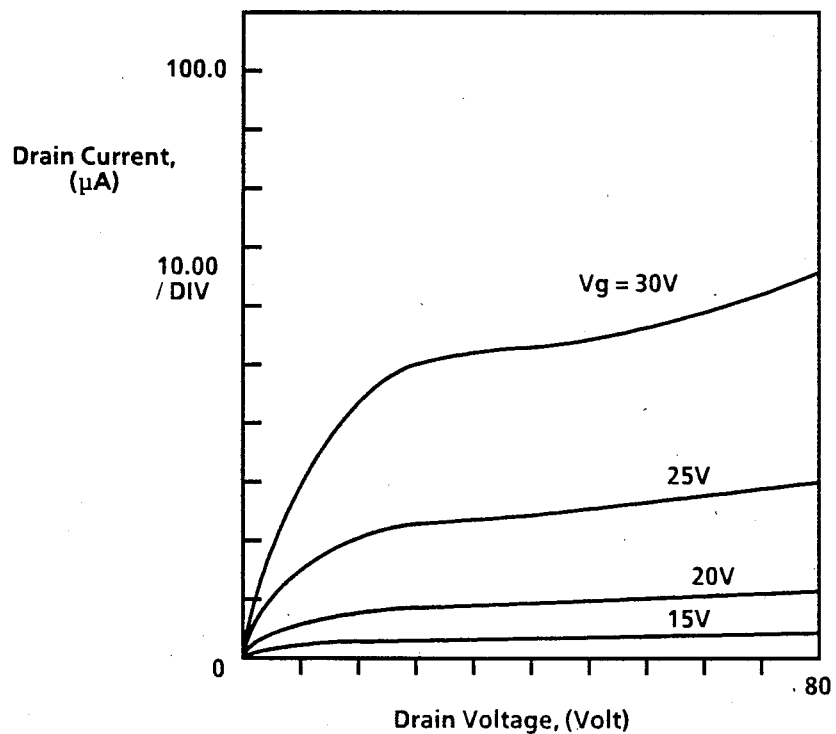
FIG. 7 shows plots of the I-V characteristics of my ITGO high voltage thin film transistor.

Device measurements of my ITGO device, operating in the tied-gates mode are shown in FIG. 1 (curves C and D - solid lines) along with measurements of a conventional dual-gate device (curves A and B -dotted lines, discussed supra). It should be noted that the results are plotted in logarithmic scale to depict the low OFF-state leakage current. Both devices were on the same chip and each was operated in the tied-gates mode. The intra-gate region of the conventional dual-gate device is heavily doped n+, as are the source and drain implants. The offset region of the ITGO device was defined at 30 μm and was lightly doped n− at $2E12$ cm$^{-2}$, which was implanted immediately after the gate definition. Typical drain currents, $I_D$, for the OFF-state (measured at $V_G=0$ volts) are shown in curve C of FIG. 1 and for the ON-state (measured at $V_G=30$ volts) in curve D. The I-V characteristics of the ITGO device are shown in FIG. 7.

My new device can be viewed as two transistors in series. One is a low voltage device on the drain side and the other is a conventional high voltage offset-gate device on the source side. Thus, it can operate in the tied-gates mode as a high voltage device because the OFF-state leakage current will be limited by the source-side high voltage transistor when $V_G$ is OFF. For the fixed-biased mode (e.g., dummy drain tied to $V_{DD}$), the ITGO device operation is essentially the same as that of a conventional HVTFT with the same offset length $L_{OFF}$. The induced n+ channel under the drain-side transistor will serve as the n+ drain of the HV device. Since such a device will have an effective shallow n+ junction (about 100 Å), the short-channel effects are expected to be better than conventional HV devices. The operation of the ITGO device under tied-drain mode is similar to that of the fixed-bias mode except that the drain current would not conduct for $V_D<V_{TH}$. The ITGO device under both fixed-bias mode and tied-drain mode would have higher drive current and less electric field stress across the gate dielectric. However, the tied-gates mode has the advantage of being symmetrical and requires no extra contacts and wiring.

The ITGO HVTFT device can also operate with the dummy-drain floating. In this floating-gate mode, the device will not be ON until $V_D$ is large enough to ensure proper potential coupling to the floating dummy-drain, or until $V_D$ is larger than the gate-induced drain breakdown voltage.

Figure 8:
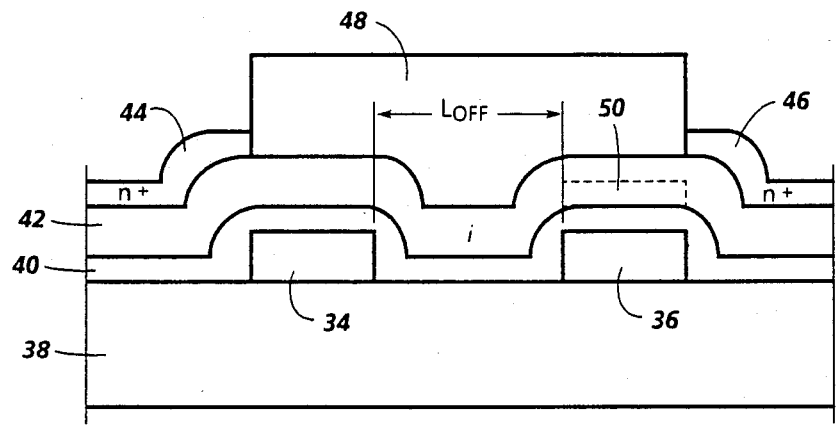
FIG. 8 is a view of an inverted ITGO high voltage thin film transistor.

If desired, the ITGO HVTFT can also be configured as an inverted-staggered device structure, as illustrated in FIG. 8. To this end, a pair of gates 34 and 36, patterned by a single mask, is deposited directly upon a glass or quartz substrate 38. A gate dielectric layer 40 overlies the gates and a non-single crystal semiconductor active layer 42 overlies the dielectric layer. Heavily doped semiconductor source and drain electrodes 44 and 46 are self-aligned to the outer edges of the gates 34 and 36, and are separated by a thick passivation layer 48 overlying the active layer 42. Gate 34 is the device control gate and gate 36 serves as a dummy drain. Since both gates are defined at the same mask level, the offset region $L_{OFF}$ therebetween is self aligned to their inner edges, resulting in a very accurate definition of this critical parameter. I have also shown the conductive channel 50 which will be induced in the active layer, in the region over the dummy drain 36, during operation of this device.

Figure 9A:
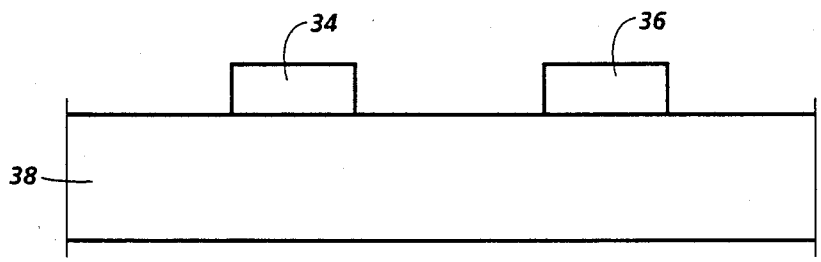
FIGS. 9a to 9f illustrate the steps for fabricating the device of FIG. 8.
Figure 9B:
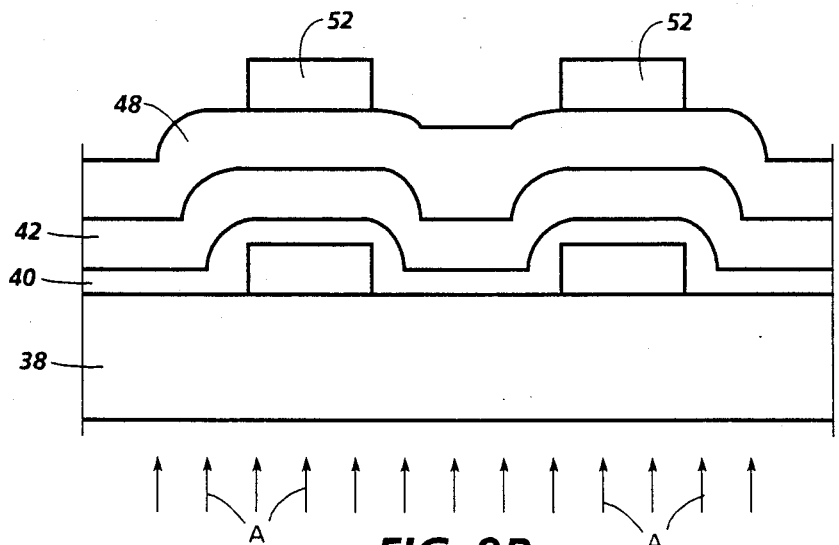
Figure 9C:
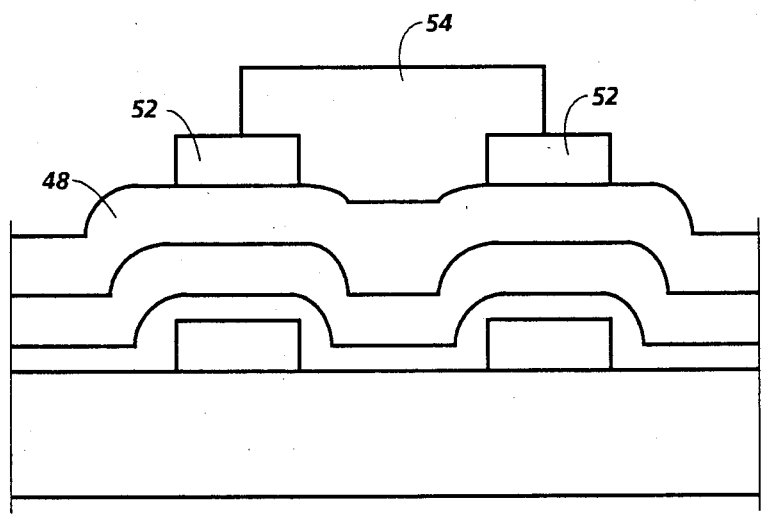
Figure 9D:
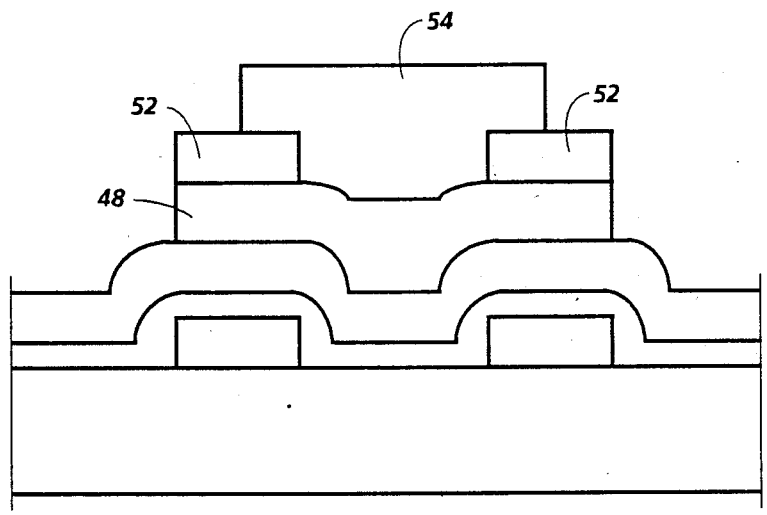
Figure 9E:
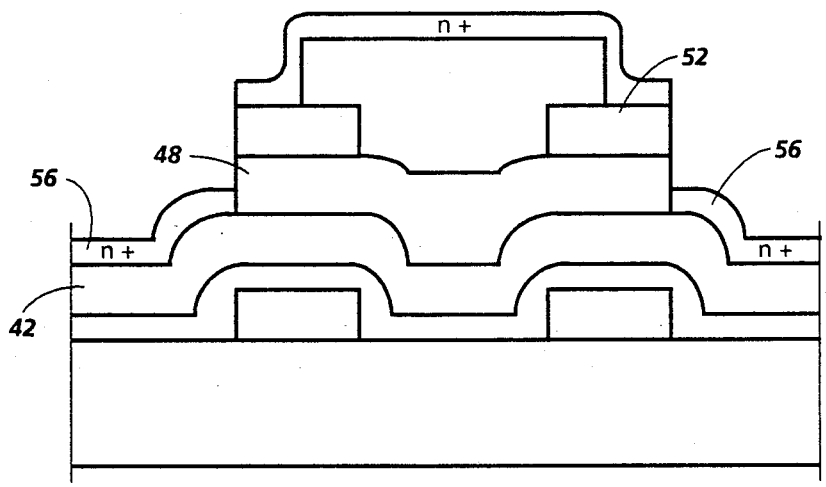
Figure 9F:
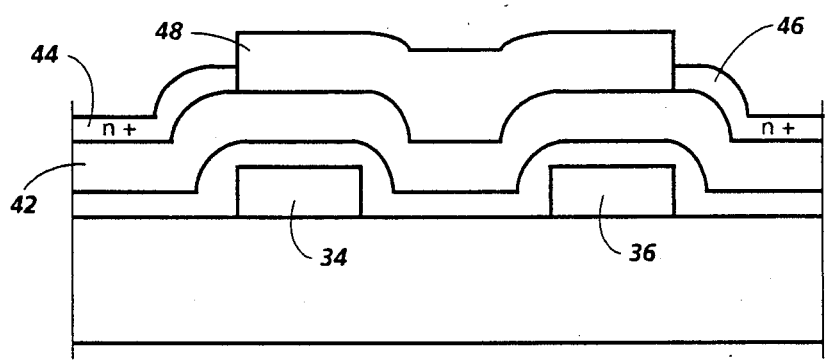

The fabrication process for the inverted-staggered ITGO HVTFT of FIG. 8 will now be described with reference to FIGS. 9a to 9f. The control gate 34 and a dummy-drain gate 36 (comprising, for example, Cr in amorphous silicon devices, and doped-poly in polycrystalline TFTs) are first patterned, upon a quartz or glass substrate 38 (FIG. 9a), by a single mask which establishes the desired length of the critical offset region ($L_{OFF}$) by the separation of the two gates. Following that, the gate dielectric 40, the active non-single crystal semiconductor layer 42, and the upper passivation layer 48 are formed consecutively. A photoresist layer deposited over the passivation layer is exposed through the substrate (as indicated by arrows A) so that the gates themselves pattern the photoresist in alignment therewith and form photoresist mask 52 (FIG. 9b). Then, without stripping the photoresist, a rough n+ mask 54 is used to double-coat an additional photoresist on top of the offset region (FIG. 9c). The upper passivation layer 48 is then etched using the double photoresist 52/54 as the mask (FIG. 9d), and then a thin n+ layer 56 is deposited. By way of example, I have shown vertical deposition of this layer (FIG. 9e). Directional deposition is non-conformal and results in a discontinuity in the n+ layer along the steep side walls of the etched passivation layer 48 and the photoresist mask 52. Next, the photoresist 52/54 is lifted off along with the overlying n+ layer 56 leaving the n+ source and drain regions 44 and 46 self-aligned to the outside edges of the control gate 34 and dummy-drain gate 36 (FIG. 9f). As an alternative, an n+ ion implanted semiconductor layer may be deposited in lieu of the n+ deposited layer 56. The device can then follow a standard back-end process to completion.

My novel device, and its method of manufacture, will have a significant impact on production of HVTFTs because it alleviates one of the major contraints in their fabrication. In conventional processing, mask alignment errors cause offset length variations, preventing precision in the establishment of this parameter from device to device and from wafer to wafer. This problem is exasercbated in large area applications where alignment errors migrate. With my device there are no offset length variations. Finally, the throughput is greatly enhanced by my method because the operator need not spend the time required for alignment of critical masks.

It should be understood that the present disclosure has been made only by way of examples and that numerous other changes in details of construction and the combination and arrangement of elements, as well as other fabrication steps and their sequence of implementation, may be resorted to, without departing from the true spirit and scope of the invention as hereinafter claimed.

What is claimed:

1. A high voltage thin film transistor comprising a substrate upon which is supported
    first and second conductive gate electrodes,
    a gate dielectric layer,
    doped semiconductor source and drain electrodes in substantial alignment with the outer edges of said gate electrodes, said source electrode being aligned with said first gate electrode and said drain electrode being aligned with said second gate electrode, and
    a non-single crystal semiconductor active layer contiguous with said source and drain electrodes and spaced from said gate electrodes by said gate dielectric layer, said active layer having intrinsic or virtually intrinsic regions thereof in opposition to the bodies of each of said gate electrodes, and having an offset region between said gate electrodes in alignment with the inner edges of said gate electrodes, said offset region having a lower dopant level than said source and drain electrodes.

2. The high voltage thin film transistor as defined in claim 1 wherein said offset region is intrinsic or virtually intrinsic.

3. The high voltage thin film transistor as defined in claim 1 wherein said offset region is lightly doped.

4. The high voltage thin film transistor as defined in claim 1 wherein said source and drain electrodes are coplanar with said active layer.

5. The high voltage thin film transistor as defined in claim 1 wherein said source and drain electrodes overlie said active layer.

6. A high voltage thin film transistor comprising a high voltage transistor portion in series with a low voltage transistor portion.

* * * * *